United States Patent [19]
Satterfield et al.

[11] Patent Number: 5,364,144
[45] Date of Patent: Nov. 15, 1994

[54] CASSETTE TRANSPORTING APPARATUS

[75] Inventors: Michael J. Satterfield, Round Rock; Theodore C. Caramberis, Austin; Glenn T. Tharp, Taylor, all of Tex.

[73] Assignee: Motorola, Inc., Schaumburg, Ill.

[21] Appl. No.: 186,832

[22] Filed: Jan. 25, 1994

Related U.S. Application Data

[63] Continuation of Ser. No. 936,465, Aug. 28, 1992, abandoned.

[51] Int. Cl.⁵ .................................................. B65D 25/28
[52] U.S. Cl. .................................. 294/27.1; 206/328; 206/454
[58] Field of Search ............... 294/1.1, 2, 6, 12, 15, 294/16, 26, 27.1-34, 49, 55.5, 87.1; 16/114 R; 118/500, 503, 728; 206/328, 334, 445, 454

[56] References Cited

U.S. PATENT DOCUMENTS

| | | | |
|---|---|---|---|
| 1,569,184 | 1/1926 | Herring | 294/27.1 |
| 2,551,300 | 5/1951 | Sullivan | 294/27.1 |
| 2,965,405 | 12/1960 | Herrick | 294/27.1 |
| 3,520,570 | 7/1970 | Christopher et al. | 294/27.1 |
| 3,701,558 | 10/1972 | Baker | 294/33 |
| 3,857,598 | 12/1974 | Jelich | 294/27.1 |
| 3,861,733 | 1/1975 | Vander Mey | 294/33 |
| 3,923,191 | 12/1975 | Johnson | 294/33 X |
| 3,939,973 | 2/1976 | Wallestad | 206/328 |
| 4,195,871 | 4/1980 | Chilton et al. | 294/16 |
| 4,572,101 | 2/1986 | Lee | 118/500 |
| 4,723,799 | 2/1988 | Wollmann et al. | 294/1.1 |
| 4,728,246 | 3/1988 | Mello | 414/592 |
| 4,781,408 | 11/1988 | Hernandez | 294/33 X |
| 4,889,376 | 12/1989 | Nagy | 294/33 |
| 5,029,922 | 7/1991 | DiNapoli et al. | 294/27.1 |

FOREIGN PATENT DOCUMENTS

| | | | |
|---|---|---|---|
| 334290 | 4/1920 | Germany | 294/15 |
| 6616758 | 7/1967 | Netherlands | 294/27.1 |
| 1360698 | 7/1974 | United Kingdom | 294/15 |

OTHER PUBLICATIONS

IBM Technical Disclosure Bulletin, Feb. 1982, vol. 24, No. 9, "Wafer Boat Handles With Hook Extensions" by Gagne.
Typical Quartz Boat Fork A (drawing) (single sheet signed by first inventor and dated Aug. 21, 1992.)
Typical Quartz Boat Fork B (drawing) (single sheet signed by first inventor and dated Aug. 21, 1992.)
Fluoroware—Handling Products for the Microelectronics Industry; pp. 16–18, 20, 30–36; 46, 61, and 62 (1991).

Primary Examiner—Johnny D. Cherry
Attorney, Agent, or Firm—George R. Meyer

[57] ABSTRACT

Embodiments of the present invention include a cassette transporting apparatus having 1) a first fork member 31 and a second fork member 31, wherein each fork member 31 has a shaft 62 and a tab 63; 2) a first member 31 and a second fork member 31, wherein each fork member 31 includes a shaft 62 having a distal section 42 that is beveled; or 3) a curved handle 33. In one embodiment, the cassette transporting apparatus is a cassette fork 20 for manually transporting a cassette and includes a locking tab 63, the beveled distal section 42, and the curved handle 33. In another embodiment, the cassette transporting apparatus is a mechanical cassette transporting system 100 including an elevator 101 and the fork members 31. The design of the fork members 31 is cassette specific rather than both cassette and apparatus specific.

23 Claims, 4 Drawing Sheets

CASSETTE TRANSPORTING APPARATUS

This is a continuation of prior application Ser. No. 07/936,465, filed Aug. 28, 1992, now abandoned.

FIELD OF THE INVENTION

The present invention relates to the field of semiconductor processing equipment, and in particular, to semiconductor substrate carrier handling equipment.

BACKGROUND OF THE INVENTION

A semiconductor substrate carrier is a device capable of holding a plurality of semiconductor substrates. The semiconductor substrate carrier is typically one of two types: a semiconductor boat (boat) or a semiconductor cassette (cassette). The boat is typically used in high temperature applications, wherein the temperature is greater than about 200 degrees Celsius. The cassette is typically used in applications below about 200 degrees Celcius. Many cassettes comprise a plastic material, such as polypropylene or a perfluoroalkoxy fluorocarbon (Teflon ® PFA), for example.

Figure 1:
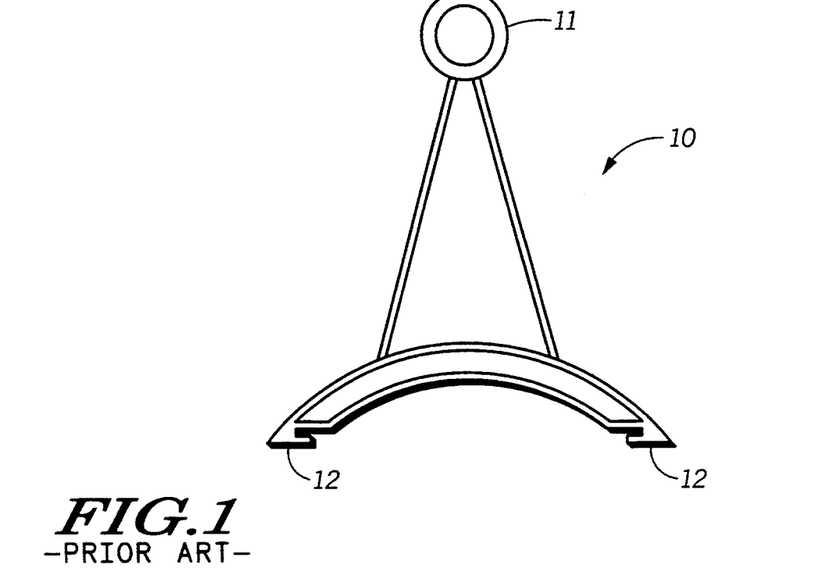
FIG. 1 includes an illustration of a ring handle used to transport cassettes. (Prior Art)

Currently, three methods of transporting a cassette are commonly used. The cassette may be transported by hand, using a ring handle, or using an elevator that is typically part of a mechanical cassette transporting system. When a person transports the cassette by holding the cassette in his or her hand, particles or sodium from the person's hand may transferred to the substrates. Particles typically increase defect density and lower the substrate yield, and sodium typically makes a metal-insulator-semiconductor device unreliable. A cassette may have flanges adjacent the top of the cassette. A ring handle 10 as shown in FIG. 1 includes the ring 11 and hooks 12 that may be slid along the flanges and over any substrates that are within the cassette. Liquids or particles on the handle may be transferred to the substrates when the handle is in contact with the cassette or when the handle is being placed on or removed from the cassette. In addition, the cassette typically must be touched by a person's hand while the ring handle is being placed on or removed from the cassette and may cause particle or sodium contamination. The ring handle 10 cannot be used to load many types of equipment including many dryers that are used to remove liquids from the surface of the substrate. Individual pieces of equipment may have a mechanical cassette transporting system including an elevator that includes fork members, but the fork members are typically not interchangeable between different types of elevators throughout the substrate fabrication area.

SUMMARY OF THE INVENTION

Embodiments of the present invention include a cassette transporting apparatus having 1) a first fork member and a second fork member, wherein each fork member has a shaft and a tab; 2) a first fork member and a second fork member, wherein each fork member includes a shaft having a distal section that is beveled; or 3) a curved handle. An embodiment of the present invention has a first fork member and a second fork member, wherein each fork member has a shaft having a distal section that is beveled and a tab, a cross member, and a curved handle. Each fork member comprises a polyetherimide material and includes: the shaft having the distal section that is beveled; a flange section at the opposite end of the fork member and having a pair of screw holes; a curved section lying adjacent the flange section and the shaft; and a locking tab with a rounded section and a locking section. The cross member comprises a polyetherimide material and has a pair of oblong-shaped countersunk openings adjacent the ends of the cross member and a pair of counter-bored openings. The curved handle includes a ribbed inner surface, openings that extend through the sides of the handle, beveled exposed corners, and a pair of screw holes. The fork members and curved handle are attached to the cross member with a pair of allen screws at each attachment point.

The embodiment briefly described above includes several benefits. The cassette fork may be mounted onto or removed from a cassette more easily. The locking tabs allow a cassette to be held in virtually any position, including upside down. The rounded section of the locking tab allows the cassette fork to be mounted onto and removed from a cassette more easily. The curved sections of the fork members act similar to a gusset plate and allow the fork members to carry a heavier load. The oblong-shaped countersunk openings of the cross members allow some side-to-side adjustment of the fork members, so that the fork members location on the cross member may be adjusted for a particular type of cassette. The fork members and the cross member have relatively good mechanical strength and chemical resistance, can be exposed to environments up to 200 degrees Celsius, and should not contaminate substrates within a cassette. The curved handle and the beveled exposed edges typically place less stress on the hand or wrist of a person using the cassette fork. The curved handle is less likely to cause or aggravate carpal tunnel syndrome to a person using the cassette fork. The ribbed inner surface and openings make the handle less likely to slip when transporting a cassette. Each fork member and the curved handle are attached to the cross member with a pair of allen screws to decrease the chances that the pieces move at attachment points.

In another embodiment, a mechanical cassette transporting system, which is a type of cassette transporting apparatus, includes an elevator with the fork members previously described. Each fork member is attached to the elevator similar to the manner of attaching the fork members to the cross member described above. In still another embodiment, the fork members and cross member may be attached to the elevator. One skilled in the art may modify other systems in a similar manner. The fork members are cassette specific as opposed to both cassette and system specific. Therefore, one type of fork member may be used on several different systems. Spare parts inventories may be reduced as a smaller number of fork member designs are used throughout a fabrication area.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

The examples below illustrate a few embodiments of the present invention. The examples are meant to be illustrative and not limiting. One skilled in the art appreciates that the embodiments described below may be changed without affecting the spirit or scope of the present invention.

EXAMPLE 1

Figure 2:
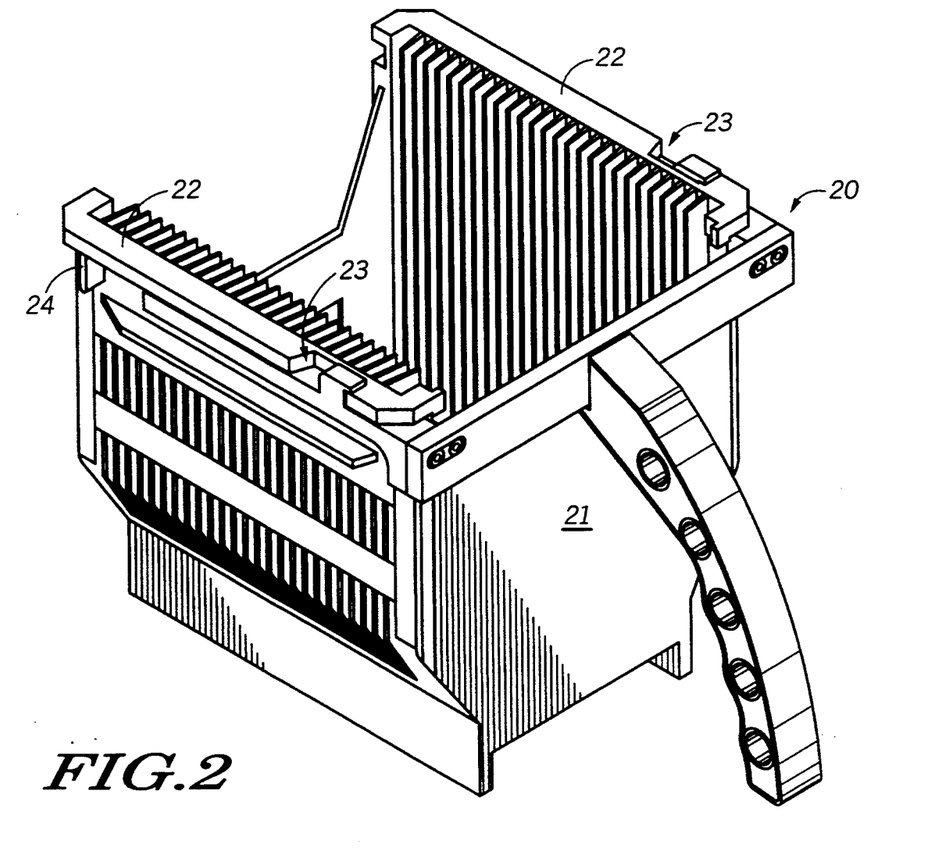
FIG. 2 includes a perspective view of a cassette and a cassette fork in accordance with an embodiment of the present invention.

In one embodiment of the present invention, a cassette transporting apparatus includes a cassette fork for manually transporting of a cassette. FIG. 2 includes an illustration of a perspective view of the cassette fork 20 and the cassette 21. The cassette has flanges 22 adjacent the top of the cassette 21, wherein each flange has a notch 23. The particular cassette used includes a handle-stop tab 24. An example of the cassette is an A182-50M model cassette made by Fluoroware.

Figure 3:
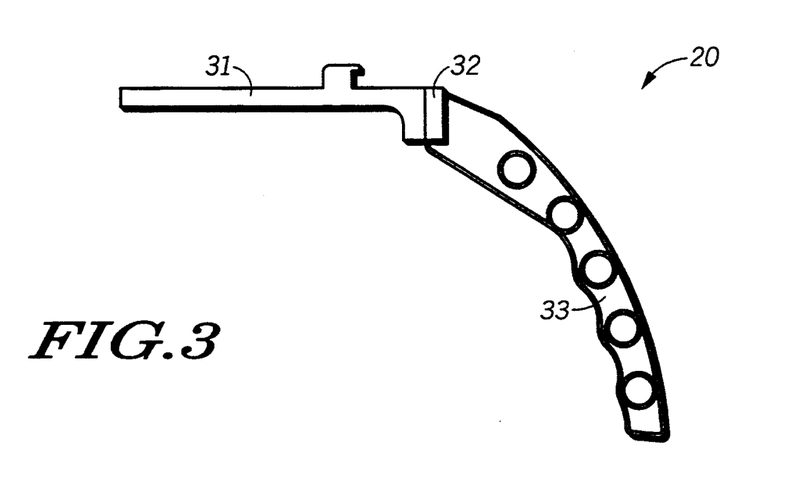
FIGS. 3, 4, and 5 include side, top, and front views, respectively, of the cassette fork of FIG. 2.
Figure 4:
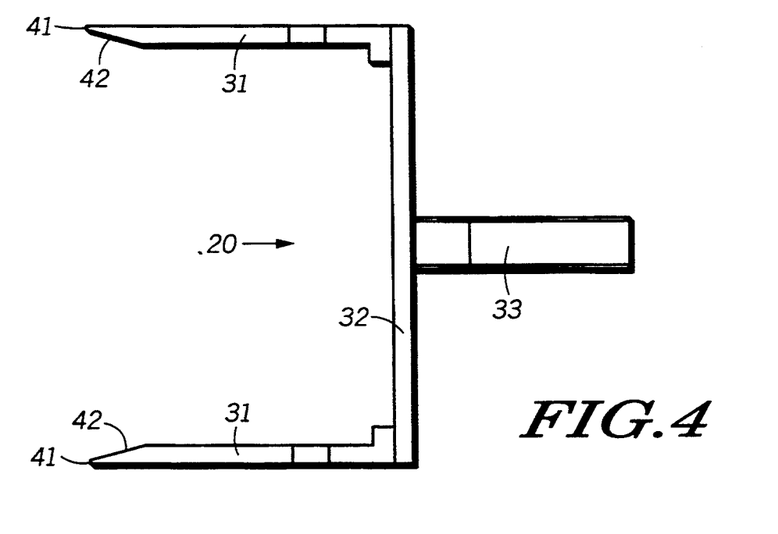
Figure 5:
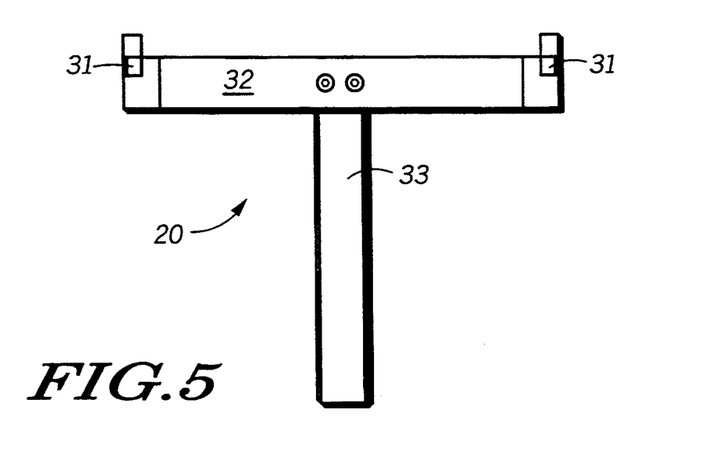
Figure 6:
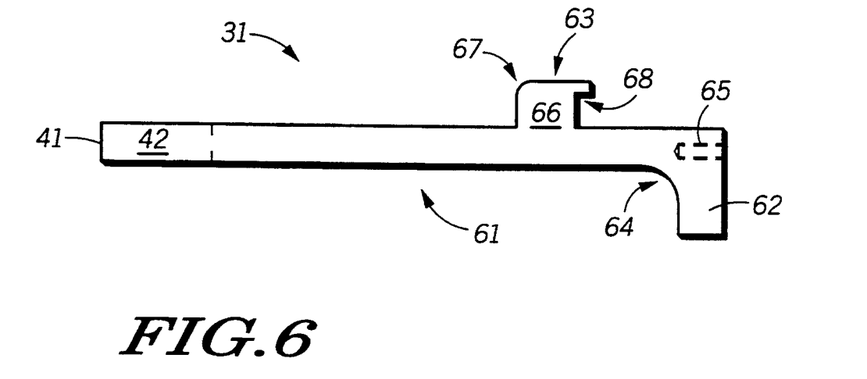
FIG. 6 includes a fork member of FIG. 2.

FIGS. 3, 4, and 5 include side, top, and end views, respectively, of the cassette fork. As shown in the three figures, the cassette fork 20 includes two fork members 31, a cross member 32, and a curved handle 33. One fork member is described below. The other fork member is a mirror image of the first fork member as shown in FIGS. 4 and 5. An enlarged view of the first fork member 31 appears in FIG. 6. The fork member 31 is about 106 millimeters long and comprises a polyetherimide material, such as Ultem ® made by General Electric Company. A fork member 31 has an adjacent end, a distal end, a middle section, and a distal section, and the fork member includes a shaft 61, a curved section 64, a flange 62, and a locking tab 63. The shaft 61 has overall dimensions of about 98 millimeters long, about 5.9 millimeters wide, and about 7.2 millimeters high. The fork member has a blunted distal end 41 about 1.0 millimeter wide at the end of the shaft 61 as shown in FIG. 4. The distal section 42 is beveled at an angle of about 15 degrees as measured from a plane that generally lies along the length of the shaft as shown in FIG. 4. The curved section 64 lies adjacent to a location where the shaft 61 and the flange 62 meet as shown in FIG. 6 and has an edge that forms a radius of curvature of about 4.8 millimeters.

The flange 62 lies adjacent the fork member 31 and has dimensions of about 7.9 millimeters long, about 14 millimeters wide, and about 19 millimeters high, as measured in the same directions as the shaft 61. The flange 62 includes a pair screw holes. FIG. 6 includes a screw hole 65, and the other screw hole (not shown) lies directly behind it. The dimensions of the holes are similar, but their location within the flange 62 is different. The center of the screw hole 65 is located about 3.2 millimeters from the side of the flange 62, and the center of the other screw hole (not shown) is about 3.2 millimeters from the opposite side of the flange 62. The centers of both screw holes are about 14 millimeters above the bottom of the flange 62. The locking tab 63 is located on the top of the shaft 61 along the middle section of the fork member 31 about 71 millimeters from the distal end of the fork member 31. The locking tab 63 has a main body 66 that is about 14.5 millimeters long, about as wide as the shaft, and about 5.5 millimeters high. The locking tab 63 has a rounded section 67 with a radius of curvature of about 2.8 millimeters. The rounded section 67 is located adjacent to the upper surface of the locking tab 63 and the side of the locking tab 63 that is closer to the distal end 41 of the fork member 31. The locking tab 63 also has a locking section 68 located adjacent the top and the side of the main body 66 closer to the adjacent end of the fork member 31. The locking section 68 extends about 3.2 millimeters towards the adjacent end of the fork member 31, is about the same width as the locking tab 63, and is about 2.3 millimeters high. In this embodiment, the entire fork member is made by injection molding the polyetherimide material. The other fork member is virtually a mirror image of the fork member described above.

Figure 7:
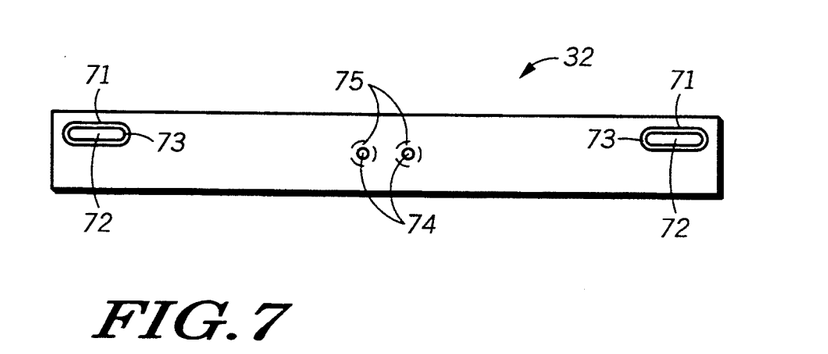
FIG. 7 includes a cross member of FIG. 2.

The cross member 32 comprises the polyetherimide material and is about 152 millimeters long, about 19 millimeters high, and about 6.4 millimeters thick as shown in FIG. 7. Each end of the cross member has a countersunk opening 71 that is generally oblong-shaped and provides a mounting location for one of the fork members 31. The openings 71 each has an opening portion 72 and a countersunk portion 73. The opening portion 72 extends through the cross member 32 and is about 14 millimeters long at its longest point and about 3.0 millimeters wide at its widest point, and the countersunk portion 73 extends about half way through the thickness of the cross member 32 is about 16 millimeters long at its longest point and about 5.0 millimeters wide at its widest point. The centers of both countersunk openings 71 are located about 14 millimeters from the bottom of the cross member and about 9.0 millimeters from the their respective ends of the cross member 32. The flange sections 62 of the fork members 31 are attached to the end segments of the cross member 32 as shown in FIG. 4. Each flange section 62 is attached to the cross member 32 with two 4-40 type knurled allen screws (not shown), wherein the knurled portions of the allen screws lie within the countersunk portion of the oblong-shaped countersunk opening 71. The length of the threaded portion of each allen screw is about 10 millimeters long. The fork members 31 are attached to the cross member 32 such that the shafts 61 of the fork members generally lie along a plane. The cross member has two additional openings 74 located within a middle segment of the cross member 32 as shown in FIG. 7. The centers of the openings 74 are located about 9.5 millimeters from the bottom of the cross member 32. One center of the opening 74 is about 5.8 millimeters away from the center of the cross member, and the center of the other opening 74 is about 5.8 millimeters in the opposite direction away from the center of the cross member 32. The openings 74 each has a counter-bored portion 75 that is located on the side of the cross member opposite the countersunk portions 73 of the oblong-shaped countersunk openings 71. Each counter-bored portion 75 is configured such that a flat head screw is capable of lying generally flush with the cross member 32. In this embodiment, the cross member is made by injection molding the polyetherimide material.

Figure 8:
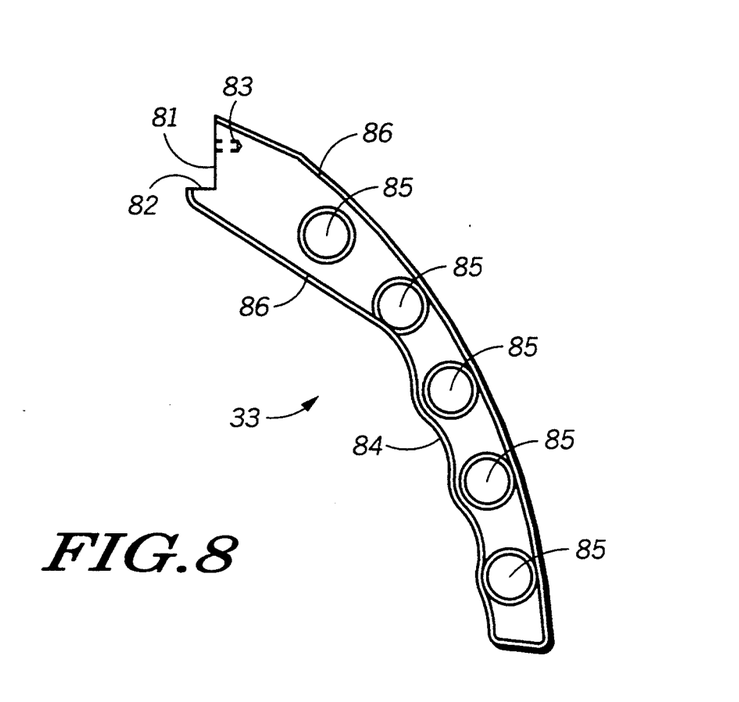
FIG. 8 includes a curved handle of FIG. 2.

The curved handle 33, when viewed from the side as shown in FIG. 8, extends about 98 millimeters in the lateral direction and about 106 millimeters in the vertical direction. From the same view, the width of the curve handle 33 is about 26 millimeters at its widest point and about 17 millimeters wide at its narrowest point. The curved handle 33 is about 19 millimeters deep as measured in a direction normal to the surface seen in FIG. 8. The adjacent end has a flat section 81 that extends about 18 millimeters from the top of the curved handle 33. The adjacent end has a ledge 82 that lies at the bottom of the flat section 81. The ledge 82 is generally perpendicular to the flat section 81 and extends about 6.4 millimeters from the flat section 81. The adjacent end includes two screw holes, which includes screw hole 83, that extend from the flat section 81 into the handle The holes should be in line with the two openings 74 near the center of the cross member 32. The cross member 32 is attached to the curved handle using two 4–40 type flat-head allen screws (not shown), such that the cross member 32 lies on the ledge 82 and along the flat section 81. The curvature of the curved handle 33 is such that a point on the curved handle 33 near the distal end of the curved handle 33 is generally perpendicular to the plane that the fork members generally lie along. The curved handle 33 has an inner edge 84 that is ribbed and five openings 85 each about 11 millimeters in diameter that extend through the sides of the handle. All exposed edges 86 of the curved handle 33 including the openings 85 are beveled. The flat section 81 and the ledge 82 are not beveled because they are not exposed when the cross member 32 is attached to the curved handle 33. In this embodiment, the curved handle 33 is made by injection molding a polypropylene material.

The embodiment described above includes several benefits. The beveled distal sections 42 of the fork members 31 allow the cassette fork 20 to be mounted onto or removed from a cassette more easily compared to the ring handle 10. The locking tabs 63 allow a cassette to be held in virtually any position, including upside down. Other considerations, such as keeping a substrate within the cassette, typically limit the positions in which the cassette is placed. The rounded section 67 of the locking tab 63 allows the cassette fork 20 to be mounted onto and removed from a cassette more easily than if a squared section was used. The curved sections 64 of the fork members 31 act similar to a gusset plate and allow the fork members 31 to carry a heavier load than if the curved section 64 is not present. The oblong-shaped countersunk openings 71 of the cross members allow some side-to-side adjustment of the fork members, so that the fork members 31 location on the cross member 32 may be adjusted for a particular type of cassette. The fork members 31 and the cross member 32 comprise the polyetherimide material, which has relatively good mechanical strength and chemical resistance, can be exposed to environments up to 200 degrees Celsius, and should not contaminate substrates within a cassette.

The curved handle 33 and the beveled exposed edges 86 typically place less stress on the hand or wrist of a person using the cassette fork 20. The curved handle 33 is less likely to cause or aggravate carpal tunnel syndrome to a person using the cassette fork. The beveled exposed edges 86 of the curved handle 33 reduce isolated stress points on a person's fingers or palm compared to squared exposed edges. The ribbed inner surface 84 and openings 85 make the handle less likely to slip when transporting a cassette. The openings 85 may allow a portion of the tips of the user's fingers to be placed within the holes. Each fork member 31 and the curved handle 33 are attached to the cross member 32 with a pair of allen screws. The plurality of screws decrease the chances that the pieces move. If a single screw is used to attach a fork member or the curved handle to the cross member, the pieces would be more likely to rotate about the screw. The rotation increases the chances that a substrate may fall out of a cassette or that the cassette may fall from the cassette fork. The fork handle 20 has a balancing point. If a fork handle 20, which has a cassette mounted to it, is ever held by a single finger of an operator, it is possible to hold the fork handle at the balancing point and without having any substrates fall from the cassette.

EXAMPLE 2

Figure 9:
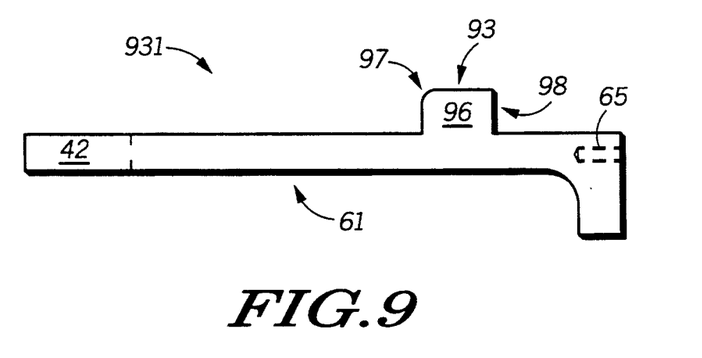
FIG. 9 includes a fork member of a second embodiment.

In a second embodiment, the locking tabs 63 of the fork members 31 are replaced by tabs 93 of fork members 931, which are hereinafter referred to as simple tabs 93 as shown in FIG. 9. Each of the simple tabs 93 has a main body 96 and a curved section 97 similar to the main body 66 and the curved section 67 of the locking tabs 63 of Example 1, but the simple tab 93 does not have a locking section 68. The side 98 of the simple tab 93 closer to the adjacent end of the fork member 31 is generally flat and perpendicular to the length of the fork member 31. The simple tab 93 is easier to manufacture than the locking tab 63.

EXAMPLE 3

Figure 10:
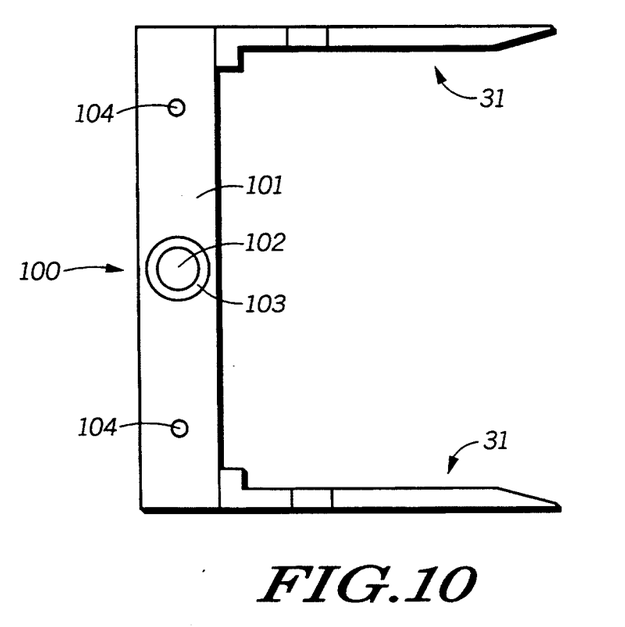
FIGS. 10 and 11 include a top and front view, respectively, of a mechanical cassette transporting system in accordance with a third embodiment.
Figure 11:
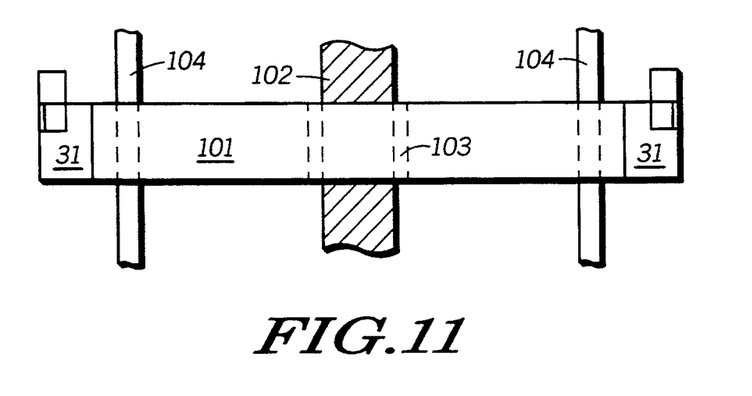

In a third embodiment, a mechanical cassette transporting system 100, which is a type of cassette transporting apparatus, includes an elevator 101 with the fork members 31 previously described. FIGS. 10 and 11 include a top view and a front view, respectively, of the system 100. The system 100 is typically part of or used in conjunction with a piece of processing equipment, such as a semiconductor furnace or a wet chemical bench, for example. Each fork member 31 is attached to the elevator 101 similar to the manner of attaching the fork members 31 to the cross member 32 described above. The elevator 101 is capable of being raised and lowered by worm gear 102. A bushing 103 that is mounted within the elevator keeps the worm gear 102 from directly contacting the elevator 101. Stabilizer bars 104 keep the elevator 101 from spinning when the elevator 101 is raised or lowered. In another embodiment (not shown), the fork members 31 and cross member 32 may be attached to the elevator 101.

One skilled in the art may modify other systems in a similar manner. One skilled in the art appreciates that the mechanical cassette transporting system may be an automatic or manual system. An automatic system may be very complex and be capable of movement in virtually any direction. Therefore, the mechanical cassette transporting system may be integrated with robots or robotic types of equipment, such as a three-axis arm, for example. A crank may be attached to the worm gear 102 to form a manual mechanical cassette transporting system. Therefore, many types of cassette transporting equipment may use the fork members of the present invention.

As seen with embodiments described above, the fork members 31 are cassette specific as opposed to both cassette and system specific. Therefore, one type of fork member may be used on several different systems. Spare parts inventories may be reduced as a smaller number of fork member designs are used throughout the fabrication area.

Alternate Materials, Manufacturing Options, and Dimensions

One skilled in the art appreciates that the materials used and the dimensions of the fork may be changed to meet the requirements of one's applications. The fork members 31 and the cross member 32 may come into direct contact with a cassette. Therefore, the fork members 31 and cross member 32 should comprise a material that does not generate particles or contaminate the substrates. If the fork is used in an environment including chemicals or temperatures higher than about room temperature, the fork members 31 and cross member 32 should comprise a material that can withstand the environment. There are a plethora of materials that may be used for exposures to chemicals or temperatures significantly higher than room temperature. These materials may include one or more of the following: polyetherimide (Ultem ®); acetal resins (Delrin ®); fluorocarbons including perfluoroalkoxy (Teflon ® PFA) or trifluoroethylene (Teflon ® TFE); and polyimide and aramid resins (Velpel ®). One skilled in the art appreciates that there are other materials currently available that are also tolerant to chemicals or heat, and that the list above is not to be construed as limiting. Many different materials, such as polypropylene, nylon, acrylonitrile-butadiene-styrene materials, or other plastic materials that are generally rigid, may be used if the fork members and cross member are not exposed to environments including chemicals or temperatures higher than about room temperature. The fork members or cross member may include a plastic material that is not generally rigid if the non-rigid plastic material is coated over or attached to a support member that is rigid. For example, a fork member may include a metal support member that is coated with a silicone rubber material and configured such that the coated fork member has the desired dimensions as previously stated. Rigid plastic materials may be coated over or attached to the support member in a similar manner, if desired. The fork members and cross member may comprise a material including a metal or a metal alloy, so long as the material does not contact the cassette. The curved handle may comprise a material that also may be used for a fork member or cross member that is not exposed to environments including chemicals or temperatures higher than about room temperature. Because the curved handle typically does not contact the cassette or substrates, the curved handle may contain only metallic or metal alloy materials in other embodiments.

One skilled in the art appreciates that the fork may be formed using other manufacturing techniques. The fork members and/or the cross member and/or the curved handle may be injected molded simultaneously. If the fork members and cross member are injected molded to form a single piece, the separation between the fork members may not be adjustable. The fork members, cross member, or curved handle may be machined from a single piece of material. In another embodiment, the shaft, locking tab, and flange section of a fork member may be separate pieces that are connected together by screws or rivets or are fused or welded together. In a similar fashion, the fork members, cross member, and curved handle may be connected together using rivets or may be fused or welded together. Some manufacturing options have been listed. One skilled in the art appreciates that the manufacturing options may be determined by the application in which the fork is to be used.

The embodiments described above include many dimensional details. A cassette fork made with the dimensions recited above may be used in conjunction with a cassette having flanges along opposite sides of the cassette. An A182-50M (Teflon ® PFA) model cassette or a PA182-50M (polypropylene) model cassette (both cassettes being made by Fluoroware) may be used with the fork members in any of the embodiments described above. The degree to which the distal sections 42 of the fork members are beveled may be changed. The beveling should not extend into or underneath the tabs because if the beveling extends into or under the tabs, the mechanical strength of the tabs may be compromised. On the other hand, beveling is not required, and in an alternate embodiment, the distal end of the fork member may be squared. The beveling may form a pointed distal end rather than the blunted distal end 41. The blunted end 41 may be rounded, as seen by a top view, rather than squared. The curved sections 64 adjacent the shaft and the flange section are not required. The oblong-shaped openings 71 should be long enough to compensate for any dimensional tolerances in the location of the openings 65 within the fork members 31 and the dimensional tolerances of the cassette. The overall height of the cassette fork for an A182-50M or PA182-50M cassette should not be more than about 140 millimeters. Otherwise, a person using the cassette fork may have to use his or her hand to adjust the cassette to use the cassette fork, which defeats a purpose of the cassette fork. The curved handle, the ribbed inner edge, or the holes are not required. A different handle, such as a rod, for example, may be used in place of the curved handle.

The cassette transporting apparatus may be used with cassettes of any size including those that are capable of holding substrates with diameters in a range of about 50–200 millimeters. Each cassette manufacturer typically has a diagram with dimensions and dimensional tolerances. The diagrams with dimensions and dimensional tolerances should be used in determining the dimensions of the various parts of the cassette transporting apparatus. The cassettes need to have flanges on opposite sides of the cassette, wherein each flange has a notch. The flange may be located at any height along the sides of the cassette. If the cassette does not have a handle-stop tab 24, such as the PA 182-50M cassette, the fork members may be designed so that they may be inserted from the opposite end of the cassette. The notch may lie at the side of the cassette, or the flange may be configured such that a portion of the flange lies between the notch and the side of the cassette.

In the foregoing specification, the invention has been described with reference to specific embodiments thereof. It will, however, be evident that various modifications and changes may be made thereto without departing from the broader spirit or scope of the invention as set forth in the appended claims. The specification and drawings are, accordingly, to be regarded in an illustrative rather than a restrictive sense.

What is claimed is:

1. A semiconductor cassette transporting apparatus comprising a first fork member and a second fork member, wherein each fork member is generally rigid and has:

a flange;

a shaft having:

a first end and a second end that is opposite the first end, wherein the first end of the shaft is adjacent to the flange;

a beveled section that lies adjacent to the second end of the shaft; and a first side and a second side that is opposite the first side; and a tab located adjacent to the first side of the shaft and spaced away from the beveled section, wherein the tab includes:

a main body section extending from the shaft in a direction away from the second side; and a locking section that extends from the main body section in a direction towards the first end of the shaft, wherein the locking section is spaced away from the first side of the shaft.

2. The semiconductor cassette transporting apparatus of claim 1, further comprising a cross member having a first segment, a second segment, and a middle segment, wherein:

the first and second segments lie at opposite ends of the cross member and are separated from each other by the middle segment;

the flange of the first fork member is attached to the first segment of the cross member; and the flange of the second fork member is attached to the second segment of the cross member such that the first and second fork members generally lie along a first plane and extend from the cross member in a first direction.

3. The semiconductor cassette transporting apparatus of claim 2, further comprising a curved handle, wherein an end of the curved handle is attached to the middle segment of the cross member.

4. The cassette transporting apparatus of claim 3, wherein the curved handle further comprises a grip section having a surface that is ribbed.

5. The semiconductor transporting apparatus of claim 4, wherein the curved handle further comprises an opening that extends through the curved handle.

6. The semiconductor cassette transporting apparatus of claim 3, wherein the curved handle includes a material selected from a group consisting of polyetherimide, an acetal resin, an aramid resin, a perfluoroalkoxy fluorocarbon, trifluoroethylene, polypropylene, nylon, an acrylonitrile-butadiene-styrene material, a metallic material, and a metal alloy material.

7. The semiconductor transporting apparatus of claim 2, wherein each of the first and second segments of the cross member includes an oblong-shaped, countersunk opening.

8. The semiconductor cassette transporting apparatus of claim 2, wherein the cross member includes a material selected from a group consisting of polyetherimide, an acetal resin, and an aramid resin.

9. The semiconductor cassette transporting apparatus of claim 1, wherein the first and second fork members include a material selected from a group consisting of polyetherimide, an acetal resin, and an aramid resin.

10. The semiconductor cassette transporting apparatus of claim 1, wherein:

each of the shafts of the fork members has a length that extends in a first direction; and the beveled section of each of the fork members has a surface that lies along a plane at an angle that is about 15 degrees from the first direction.

11. A semiconductor cassette transporting apparatus comprising:

a first fork member and a second fork member, wherein each fork member has:

a flange;

a shaft having:

a first end and a second end that is opposite the first end, wherein the first end of the shaft is adjacent to the flange;

a beveled section that lies adjacent to the second end of the shaft; and a first side and a second side that is opposite the first side; and a tab located adjacent to the first side of the shaft, spaced away from the beveled section, and lying closer to the flange compared to the beveled section, wherein the tab includes:

a main body section extending from the shaft in a direction away from the second side; and a locking section that extends from the main body section in a direction towards the first end of the shaft, wherein the locking section is spaced away from the first side of the shaft;

a cross member having a first segment, a second segment, and a middle segment, wherein:

the first and second segments lie at opposite ends of the cross member and are separated from each other by the middle segment;

the flange of the first fork member is attached to the first segment of the cross member; and the flange of the second fork member is attached to the second segment of the cross member such that the first and second fork members generally lie along a first plane and are substantially parallel to each other; and a curved handle, wherein:

an end of the curved handle is attached to the middle segment of the cross member; and the curved handle consists of a single piece of material.

12. The semiconductor cassette transporting apparatus of claim 11, wherein the curved handle further comprises a grip section having a surface that is ribbed.

13. The semiconductor transporting apparatus of claim 11, wherein the curved handle further comprises an opening that extends through the curved handle.

14. The semiconductor transporting apparatus of claim 11, wherein each of the first and second segments of the cross member includes an oblong-shaped, countersunk opening.

15. The semiconductor cassette transporting apparatus of claim 11, wherein the first and second fork members include a material selected from a group consisting of polyetherimide, an acetal resin, and an aramid resin.

16. The semiconductor cassette transporting apparatus of claim 11, wherein the cross member includes a material selected from a group consisting of polyetherimide, an acetal resin, and an aramid resin.

17. The semiconductor cassette transporting apparatus of claim 11, wherein the curved handle includes a material selected from a group consisting of polyetherimide, an acetal resin, an aramid resin, a perfluoroalkoxy fluorocarbon, trifluoroethylene, polypropylene, nylon, an acrylonitrile-butadiene-styrene material, a metallic material, and a metal alloy material.

18. The semiconductor cassette transporting apparatus of claim 11, wherein:

each of the shafts of the fork members has a length that extends in a first direction; and the beveled section of each of the fork members has a surface that lies along a plane at an angle that is about 15 degrees from the first direction.

19. A semiconductor cassette transporting system comprising:
- a semiconductor cassette having a first flange and a second flange, wherein each flange has a first end and a second end and a notch that lies between the first and second ends; and
- a semiconductor cassette transporting apparatus including:
  - a first fork member and a second fork member, wherein each fork member has:
    - a flange;
    - a shaft having:
      - a first end and a second end that is opposite the first end, wherein the first end of the shaft is adjacent to the flange;
      - a beveled section that lies adjacent to the second end of the shaft; and
      - a first side and a second side that is opposite the first side; and
    - a tab located adjacent to the first side of the shaft, spaced away from the beveled section, and lying closer to the flange compared to the beveled section, wherein the tab includes:
      - a main body section extending from the shaft in a direction away from the second side; and
      - a locking section that extends from the main body section in a direction towards the first end of the shaft, wherein the locking section is spaced away from the first side of the shaft;
  - a cross member having a first segment, a second segment, and a middle segment, wherein:
    - the first and second segments lie at opposite ends of the cross member and are separated from each other by the middle segment;
    - the flange of the first fork member is attached to the first segment of the cross member; and
    - the flange of the second fork member is attached to the second segment of the cross member such that the first and second fork members generally lie along a first plane and are substantially parallel to each other; and
  - a curved handle, wherein:
    - an end of the curved handle is attached to the middle segment of the cross member; and
    - the curved handle consists of a single piece of material,
  wherein the system is configured such that:
    - a portion of the main body of the first fork member lies within the notch of the first flange of the cassette;
    - a portion of the first flange of the cassette lies between the shaft of the first fork member and the locking section of the locking tab of the first fork member;
    - a portion of the main body of the second fork member lies within the notch of the second flange of the cassette; and
    - a portion of the second flange of the cassette lies between the shaft of the second fork member and the locking section of the locking tab of the second fork member.

20. The semiconductor cassette transporting apparatus of claim 19, wherein the first and second fork members include a material selected from a group consisting of polyetherimide, an acetal resin, and an aramid resin.

21. The semiconductor cassette transporting apparatus of claim 20, wherein the cross member includes a material selected from a group consisting of polyetherimide, an acetal resin, and an aramid resin.

22. The semiconductor cassette transporting apparatus of claim 21, wherein the curved handle includes a material selected from a group consisting of polyetherimide, an acetal resin, an aramid resin, a perfluoroalkoxy fluorocarbon, trifluoroethylene, polypropylene, nylon, an acrylonitrile-butadiene-styrene material, a metallic material, and a metal alloy material, and wherein one of the fork members and the curved handle include different materials.

23. The semiconductor cassette transporting apparatus of claim 22, wherein:
- the shafts of the fork members both have lengths that extend in a first direction; and
- the beveled sections of each of the fork members have a surface that lies along a plane at an angle that is about 15 degrees from the first direction.

* * * * *